United States Patent [19]

Miyazawa et al.

[11] Patent Number: 4,932,033
[45] Date of Patent: Jun. 5, 1990

[54] SEMICONDUCTOR LASER HAVING A LATERAL P-N JUNCTION UTILIZING INCLINED SURFACE AND METHOD OF MANUFACTURING SAME

[75] Inventors: Seiichi Miyazawa, Sagamihara; Mitsuru Ohtsuka, Yokohama, both of Japan

[73] Assignee: Canon Kabushiki Kaisha, Tokyo, Japan

[21] Appl. No.: 273,721

[22] Filed: Nov. 17, 1988

Related U.S. Application Data

[63] Continuation of Ser. No. 100,454, Sep. 24, 1987, abandoned.

[30] Foreign Application Priority Data

Sep. 26, 1986 [JP] Japan ............................... 61-229085
Feb. 6, 1987 [JP] Japan ............................... 62-024871

[51] Int. Cl.[5] ............................................. H01S 3/19
[52] U.S. Cl. .................................................... 372/46
[58] Field of Search ................. 372/45, 46, 44; 357/17

[56] References Cited

U.S. PATENT DOCUMENTS

| | | | |
|---|---|---|---|
| 4,653,057 | 3/1987 | Oirschot | 372/46 |
| 4,682,337 | 7/1987 | Amann | 372/44 |
| 4,719,633 | 1/1988 | Yoshikawa et al. | 372/46 |
| 4,737,961 | 4/1988 | Mori et al. | 372/46 |
| 4,785,457 | 11/1988 | Asbeck et al. | 372/45 |

OTHER PUBLICATIONS

D. L. Miller and P. M. Asbeck, "Plane-Selective Doped AlGaAs/GaAs Double Heterostructure Light Emitting Diode"*, (abstract only), Fourth International Conference Molecular Beam Epitaxy, Sep. 7-10, 1986 (*Miller, Asbeck paper presented).

Primary Examiner—James W. Davie
Attorney, Agent, or Firm—Fitzpatrick, Cella, Harper & Scinto

[57] ABSTRACT

A semiconductor laser having a laser resonator structure having a substrate with a trapezoidal projection forming on both sides of an upper base an inclined surface extending along a resonating direction of a resonator, a first semiconductor layer of a first or second conductivity type formed on the substrate, an active layer for generating a laser beam, a second semiconductor layer formed on the substrate and to which an impurity of a convertible conductivity type is doped with a portion of the second semiconductor layer above the inclined surface of the substrate having the first conductivity type and the other portion having the second conductivity type, and a pair of electrodes causing a current to flow through the active layer.

23 Claims, 8 Drawing Sheets

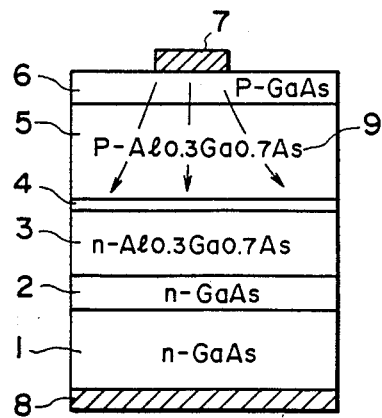
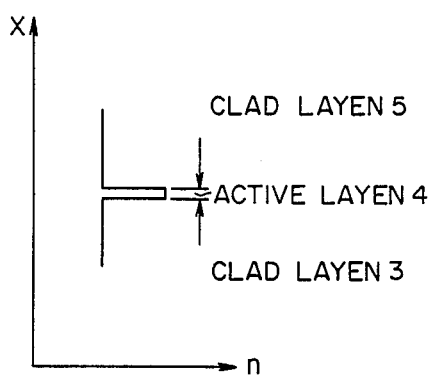
FIG. 3
PRIOR ART
FIG. 4
PRIOR ART
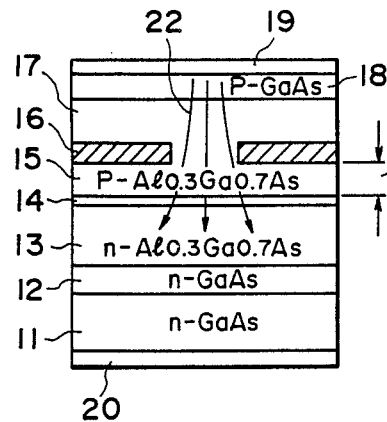
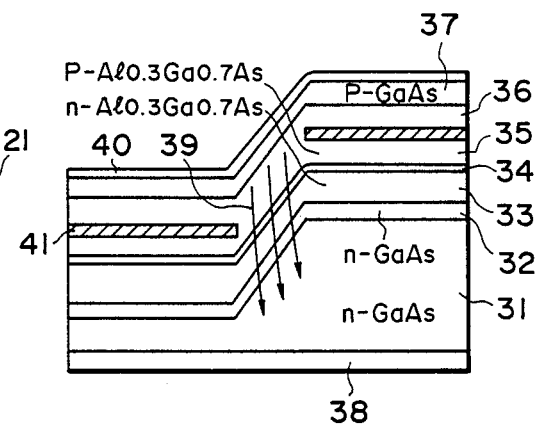
FIG. 5
PRIOR ART
FIG. 6
PRIOR ART

SEMICONDUCTOR LASER HAVING A LATERAL P-N JUNCTION UTILIZING INCLINED SURFACE AND METHOD OF MANUFACTURING SAME

This application is a continuation of application Ser. No. 100,454 filed Sept. 24, 1987, now abandoned.

BACKGROUND OF THE INVENTION

1. Field of the Invention

The present invention relates to a semiconductor laser and a method of manufacturing the same and, more particularly, to a semiconductor laser with good efficiency and a simplified method of manufacturing the same.

2. Related Background Art

Since a semiconductor laser has advantages, e.g., compact size, and easy handling, and the like, it is widely applied to a light source for a laser beam printer, a magnetooptical recording apparatus, an optical communication system, and the like.

In such a semiconductor laser, in order to efficiently emit a laser beam, a so-called stripe structure is inevitable wherein a current is concentrated on a stripe region extending along a resonating direction of a laser resonator. Upon formation of the stripe structure, many lateral p-n junctions are used. As a method of manufacturing the stripe structure, a so-called diffusion method, an ion-implantation method, and the like are known. Of these methods, the diffusion method is performed as follows.

FIGS. 1A, 1B, and 1C are sectional views showing processes in the diffusion method. As shown in FIG. 1A, a 1-$\mu$m thick mask 111 of $Si_3N_4$ is formed on an n-type GaAs substrate 110. The substrate 110 on which the mask 111 is formed is placed in a $ZnAs_2$ atmosphere, and is heated at 630° C. for several tens of minutes, so that Zn ions are diffused in the substrate 110 to a depth of about 2 $\mu$m, as shown in FIG. 1B, thereby forming p-type regions 112. Thereafter, the mask 111 is removed, and the p-type regions 112 are thus formed in the substrate 110, as shown in FIG. 1C.

The ion-implantation method will be described below.

FIGS. 2A and 2B are schematic sectional views showing processes in the ion-implantation method. As shown in FIG. 2A, a metal mask 114 is formed on an n-type GaAs substrate 113, and the resultant structure is irradiated with a $Zn^+$ beam 116 to form p-type regions 115. At this time, the crystal of the p-type regions 115 is disordered, and cannot be called a single crystal. Thus, after the mask 114 is removed, a 1-$\mu$m thick cap layer 117 of $Si_3N_4$ is deposited on the resultant structure, and is annealed at about 800° C. for about 30 minutes, thereby recovering the crystallinity of the p-type regions 115. As ions to be implanted, Si, Se, or S ions, or double implantation of Se and Ga, Ge and Ga, or Ge and As are known in addition to $Zn^{30}$.

In the conventional methods as described above, it is difficult to form a micropatterned p-n region on the order of 2 $\mu$m or less. For example, in the diffusion method, since leakage of the diffusion material occurs under the mask, the size of the mask cannot be reduced much.

In the ion-implantation method, even if the implantation region can be narrowed, impurity diffusion occurs by annealing after implantation, and an impurity region is expanded beyond the implantation region. Therefore, it is also difficult to form a micropatterned region. Furthermore, in the ion-implantation method, if a GaAs substrate is employed, defects are formed due to evaporation of As and Ga. Therefore, a high-purity film cannot be formed.

A detailed structure of a conventional semiconductor laser will now be described.

FIG. 3 is a view showing a schematic structure of a conventional semiconductor laser, and FIG. 4 is a graph showing a refractive index distribution of the laser shown in FIG. 3.

Referring to FIG. 3, a 0.5-$\mu$m thick n-GaAs buffer layer 2 is formed on an n-GaAs substrate 1, and a 1.5-$\mu$m thick n-$Ae_xGa_yAs$ (x=0.3, y=0.7) clad layer 3 is formed on the buffer layer 2.

A 0.1-$\mu$m thick nondoped GaAs active layer 4, a 1.5-$\mu$m thick p-$Ae_xGa_yAs$ (x=0.3, y=0.7) clad layer 5, and a 0.5-$\mu$m thick p-GaAs contact layer 6, an Au-Ge electrode 7, and an Au-Sn electrode 8 are sequentially formed.

When a voltage is applied to the semiconductor laser having the above-mentioned structure, a current supplied from the electrode 7 is diverged as indicated by arrows 9 before it reaches the electrode 8. For example, if the electrode 7 has a thickness of about 5 $\mu$m, the current is diverged to 4 to 5 times, as indicated by the arrows 9, and a current required for oscillation is also increased (about 150 to 200 mA).

In this related art, as shown in FIG. 4, a refractive index n of the active layer is about 3.65, and the refractive index n of the clad layers is about 3.4. Therefore, optical confinement in the vertical direction can be attained by the clad layers 3 and 5. However, optical confinement in the vertical direction cannot be performed. For this reason, light is scattered in a wider range, and hence, a differential quantum effect is degraded.

In order to eliminate the above problem, the following laser structure has been proposed.

FIGS. 5 and 6 are schematic views showing structures of other conventional semiconductor lasers.

In FIG. 5, an n-type buffer layer 12, an n-type clad layer 13, a nondoped active layer 14, and a p-type clad layer 15 are sequentially formed on an n-type substrate 11. Furthermore, an n-GaAs current block layer 16 having an opening, a p-type clad layer 17, a p-type contact layer 18, and electrodes 19 and 20 are formed on the structure.

When a voltage is applied to the structure described above, a current flows from the electrode 19 to the electrode 20. In this case, since it is not easy for a current to flow through a portion of the current block layer 16, the current is concentrated on the opening of the current block layer 16, as indicated by arrows 22.

If a distance 21 between the current block layer 16 and the active layer 14 is set to be a distance causing light absorption in the current block layer 16 in consideration of light leakage from the active layer 14, a light emitting portion is limited to the opening of the current block layer 16. Thus, a laser oscillation can be performed at a low threshold value (typically, 30 to 40 mA).

In the detailed ratings of the laser structure, the distance 21 is 0.4 $\mu$m, the thickness and the carrier concentration of the current block layer 16 are respectively 0.6 $\mu$m and $6 \times 10^{18}$ cm$^{-3}$, and the carrier concentration of the p-type clad layers 15 and 17 is $1 \times 10^{18}$ cm$^{-3}$. In addition, the opening of the current block layer 16 has a width of 3 μm.

In the semiconductor layer shown in FIG. 6, an n-type buffer layer 32, a clad layer 33, a nondoped active layer 34, p-type clad layers 35 and 36, an n-GaAs current clock layer 41 having an opening, a contact layer 37, and electrodes 40 and 38 are formed on an n-type substrate 31 having a stepped portion.

In this structure, a current is also concentrated on the opening of the current block layer 41 (arrows 39), and a refractive index difference is present in the horizontal direction due to the stepped portion. Therefore, light is confined in the stepped portion, and high efficiency can be achieved.

However, in the semiconductor laser, in order to manufacture the current block layer (16, 41), after the n-GaAs layer is formed on the entire surface, the opening must be formed by chemical etching.

For this reason, defects may be formed by etching or by attachment of dust when the structure is taken outside a deposition chamber.

Furthermore, since the current block layer (16, 41) is formed adjacent to the active layer (14, 34), the etching process cannot be precisely controlled. In particular, in the laser shown in FIG. 6, since the structure has an inclined portion, it is difficult to control the etching process.

Since the semiconductor layer must be grown before and after the etching, the manufacturing processes become complicated, and a manufacturing cost is increased.

FIG. 7 is a schematic view showing a structure of a conventional BMQW laser (Buried multiquantum well lasers). The BMQW laser is reported in, e.g., Appl. Phys. Lett. 45(1), 1 July 1984.

The structure shown in FIG. 7 includes a p-GaAs substrate 82, a p-Ae$_{x1}$Ga$_{y1}$As (x1=0.35 and y1=0.65, and these values apply to the following parameters) buffer layer 83, a p-Ae$_x$Ga$_y$As clad layer 84, a region 85 which is disordered by Zn diffusion, a Zn diffusion region 86, an SiO$_2$ current block layer 87, an AuGeNi-Au electrode 88, a Cr-Au electrode 81, an n-Ae$_{x1}$Ga$_{y1}$As upper clad layer 89 in which no Zn is diffused, an n-GaAs contact layer 90, and a BMQW active layer 91.

The feature of this laser is as follows. When the region 85 as the BMQW active layer is disordered upon Zn diffusion, the texture of the disordered region 85 is changed to cause a change in refractive index, so that light is confined in the active layer 91. Since a p-n junction is formed in the horizontal direction upon Zn diffusion, a current can be concentrated. In addition, the laser is oscillated at a low threshold level current of 33 mA.

However, in this structure, processes after Zn diffusion are required, and technical problems such as poor controllability remain unsolved.

FIG. 8 is a schematic view of a conventional BH laser (Buried-heterostructure injection lasers). The BH laser is reported in, e.g., Journal of Applied Physics, Vol. 45, No. 11, November 1974, 4899.

The structure shown in FIG. 8 includes an n-GaAs substrate 102, an n-AeGaAs layer 103 for confining a current, an oxide film 104, electrodes 101 and 105, a p-AeGaAs clad layer 106, a GaAs active layer 107, and an n-AeGaAs lower clad layer 108.

In the method of manufacturing the laser with the above structure, the lower clad layer 108, the active layer 107, and the clad laser 106 are formed on the substrate 102. Thereafter, the resultant structure is etched to remove a portion other than the central portion, thereby re-growing the n-AeGaAs layer 103 for confining the current.

This laser exhibits a very low threshold level current of 15 mA. However, the manufacturing processes are complex, as described above.

Appl. Phys. Lett. Vol. 47, No. 12, 15 December 1985 discloses a method of forming a lateral p-n junction without using the above diffusion method and the like. This method utilizes the fact that a semiconductor laser including a convertible impurity has a different conductivity type depending on the orientation of a deposition surface.

SUMMARY OF THE INVENTION

It is an object of the present invention to provide a semiconductor laser which has high reliability and can be easily manufactured at low cost, and a method of manufacturing the same.

In order to achieve the above object, there is provided a semiconductor laser comprising:

a substrate on which a stripe-like inclined surface extending along a resonating direction of a laser resonator is formed;

a first semiconductor layer formed on the substrate and having a first or second conductivity type;

a laser active layer formed on the substrate;

a second semiconductor layer which is formed on the substrate and to which an impurity of a convertible conductivity type is doped so that a portion on the inclined surface of the substrate has the first conductivity type, and the other portion has the second conductivity type; and a pair of electrodes for causing a current to flow through the laser active layer. More specifically, the present invention applies a lateral p-n junction formation method described in the above literature to manufacture a high-efficiency semiconductor laser. A deposition surface on which the second semiconductor layer is formed is formed such that a portion on the inclined surface is substantially parallel to a <110> axis represented by a lattice direction index, and forms an angle of 20° or more with a {001} plane represented by the Miller index, and the other portion forms an angle of 20° or less with the {001} plane. The <001> axis is an index indicating a lattice direction, and represents [$\bar{1}$10], [101], and [011]; and the like which are in the symmetrical relationship therewith. The {001} plane represents equivalent lattice planes (001), (010), and (100) which are in the symmetrical relationship.

BRIEF DESCRIPTION OF THE DRAWINGS

FIGS. 3 to 8 are schematic views showing structures of conventional semiconductor lasers;

DESCRIPTION OF THE PREFERRED EMBODIMENTS

Figure 1A:
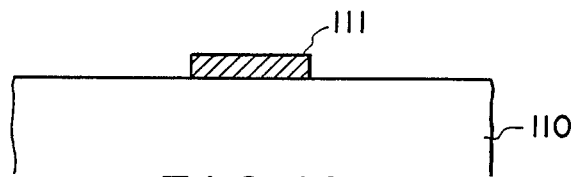
FIGS. 1A to 2B are schematic sectional views for explaining conventional lateral p-n junction formation methods.
Figure 1B:
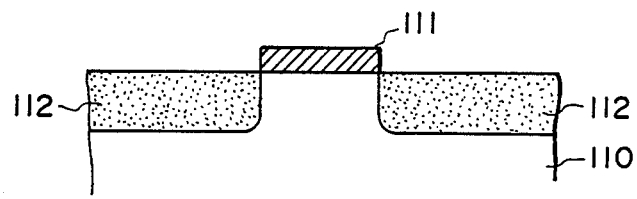
Figure 1C:
Figure 2A:
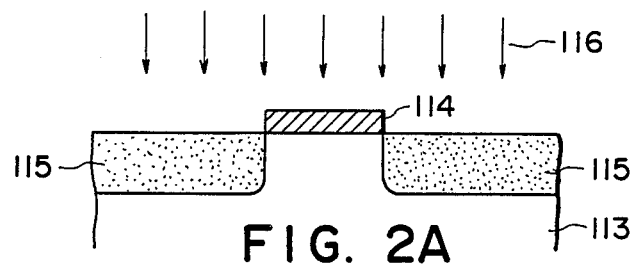
Figure 2B:
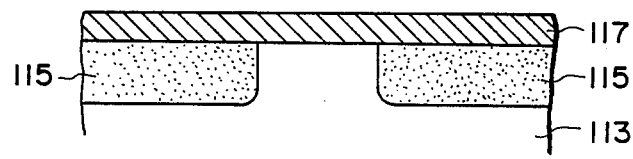
Figure 7:
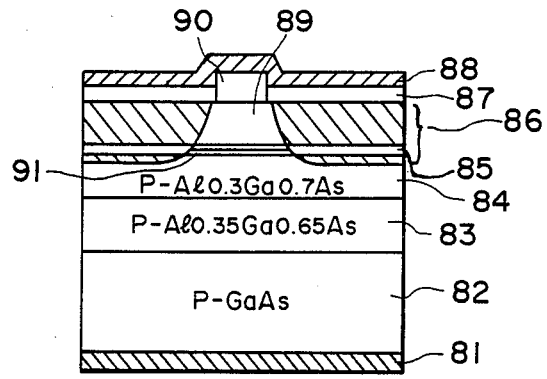
Figure 8:
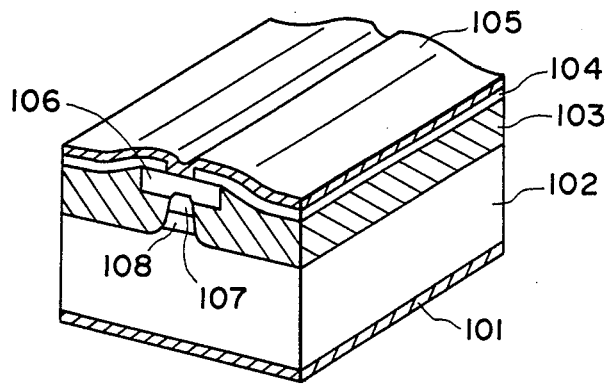
Figure 9:
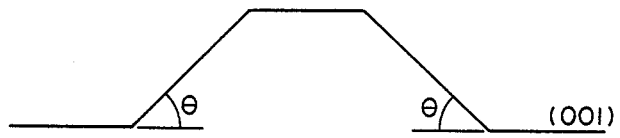
FIGS. 9 and 10 are schematic views for explaining a method of manufacturing a semiconductor laser according to the present invention.
Figure 10:
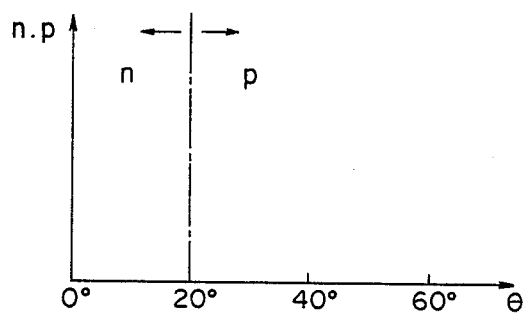

FIGS. 9 and 10 are views for explaining the principle in the manufacture of a semiconductor laser according to the present invention. FIGS. 9 and 10 are respectively a view showing an inclined surface formed on a semiconductor substrate, and a view showing a conductivity type of a semiconductor layer growing on substrates depending on an angle formed by the inclined surfaces and the (001) plane. In this case, a case will be described wherein a GaAs substrate is employed as a substrate.

When an Si-doped GaAs semiconductor is deposited on a GaAs substrate, an n-type semiconductor layer is formed. However, the n-type layer is formed only on a surface on which As is stable, i.e., a so-called As surface. In the conventional method, a semiconductor element is manufactured utilizing the As surface.

However, a Group III element such as Si serves as an n- or p-type impurity with respect to a Group III–V compound such as GaAs. If Si enters a Ga site, the resultant semiconductor layer is of n-type. If Si enters an As site, the resultant layer is of p-type. That is, when a surface which can cause Si to enter the As site can be prepared, even if Si-doped GaAs is used, a p-type semiconductor layer can be formed. Such a surface is called a Ga surface hereinafter.

The (001) plane of the GaAs substrate serves as the As surface. As shown in FIG. 9, if an inclined surface forming an angle $\theta$ with this plane to be substantially parallel to the <110> axis is formed, the Ga surface appears when $\theta$ exceeds 20°. More specifically, as shown in FIG. 9, if the angle $\theta$ formed between the inclined surface and the (001) plane exceeds 20°, a p-type semiconductor layer is formed on the inclined surface. That is, if a surface forming an angle of 20° or more with the (001) plane and a surface forming an angle of 20° or less with the plane are formed on a single substrate, p- and n-type semiconductor layers can be obtained on the corresponding surface at the same time by single growth. The surfaces can be micropatterned by etching, and the like.

The present invention controls the conductivity type of a semiconductor layer using the above principle to manufacture a semiconductor laser having a p-n region of a micropatterned structure. The method of the present invention is performed under the conditions in that a substrate temperature is about 650° C., and a GaAs growth rate is 1 μm/h. In addition, a flux ratio $J_{As4}/J_{Ga}$ is preferably 5 or less, and more preferably, 2 or less.

A detailed semiconductor laser manufactured by the method of the present invent on will now be described.

Figure 11:
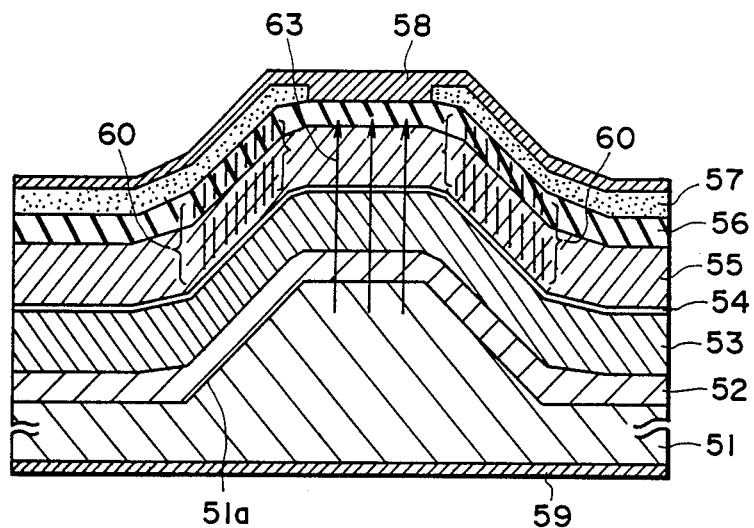
FIGS. 11 to 17 are schematic sectional views showing embodiments of a semiconductor laser according to the present invention.

FIG. 11 is a schematic sectional view of a semiconductor laser according to a first embodiment of the present invention.

Referring to FIG. 11, a p-type buffer layer 52, a p-type clad layer 53, and a nondoped active layer 54 are formed on a p-GaAs substrate 51 on which a ridge 51a (to be described later) is formed. An n-type clad layer 55 and a contact layer 56 are sequentially formed on the active layer 54. Subsequently, an insulating layer 57 is formed on the clad layer 55 except for a portion above the top portion of the ridge. Thereafter, electrodes 58 and 59 are formed on the resultant structure to complete a semiconductor laser.

The ridge 51a is a trapezoidal projection having stripe-like inclined surfaces extending in the resonating direction of a laser resonator on both the sides of a flat portion. Portions of the clad layer 55 and the contact laser 56 above the inclined surfaces serve as p-type regions 60 in accordance with the principle described with reference to FIGS. 9 and 10.

For the purpose of this invention the phrase "mound-like" or "mesa-like projector" is also employed to cover the configuration of the substrate surface in FIG. 11.

In the semiconductor laser described above, when a voltage is applied across the electrodes 58 and 59, a current is constricted by the p-type regions 60, and is concentrated between the top portion of the ridge 51a and the electrode 58, as indicated by arrows 63. Therefore, a threshold level current is low, and the active layer 54 is independently formed on the upper portion of the ridge. Therefore, an optical confinement effect can be improved, resulting in high efficiency.

A detailed method of manufacturing the semiconductor laser will be described.

A substrate 51 was prepared such that a ridge 51a was formed on a p-GaAs substrate having the (001) plane in a direction along the [110] axis. In this embodiment, the width of the top portion of the ridge was set to be 3 μm, and a step was 1.5 μm. These values can be arbitrary determined. The inclined surface was inclined at 40° with respect to the (001) plane.

The ridge 51a was formed by conventional photolithography. First, a resist film was formed, and was etched by a sulfuric acid etchant, thus forming the ridge 51a having a trapezoidal sectional shape.

If the height of the ridge 51a is increased as high as 2 to 3 μm, the substrate temperature is reduced, and an As flux is reduced, the angle of the inclined surface of the ridge can be maintained.

A 0.5-μthick Be-doped GaAs buffer layer 52 was formed on the p-GaAs substrate 51. Then, a 1.5-μm thick Be-doped $Ae_xGa_yAs$ (x=0.3, y=0.7, and they apply to the following parameters) clad layer 53 and a 0.1-μm thick nondoped GaAs active layer 54 were sequentially formed on the buffer layer 52.

A 1.5-μm thick Si-doped $Ae_xGa_yAs$ layer was then formed as the clad layer 55, and was also formed as the contact layer 56.

As described above, since an Si element serves as an n- or p-type impurity, and if the angle $\theta$ with respect to the (001) plane exceeds 20°, a p-type $Ae_xGa_yAs$ layer is formed. Therefore, when the clad layer 55 and the contact layer 56 are formed, p-type $Ae_xGa_yAs$ regions 60 are formed on portions above the inclined surfaces of the ridge 51a of the substrate 51, and the other portion serves as an n-type $Ae_xGa_yAs$ region. The above semiconductor layers were formed by the molecular beam epitaxy (MBE) method.

After a 5,000-Å thick $Si_3N_4$ insulating layer 57 was formed, only the top portion was removed by conventional photolithography. Finally, an Au-Sn electrode 58 and an Au-Zn electrode 59 were formed on the resultant structure by deposition.

Figure 12:
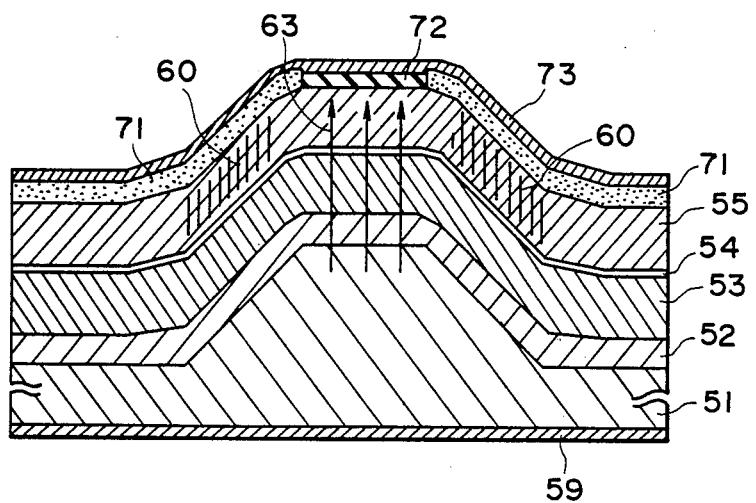

FIG. 12 is a schematic sectional view showing a semiconductor laser according to a second embodiment of the present invention. The same reference numerals in this embodiment denote the same parts as in the first embodiment.

In this embodiment, an Si-doped $Ae_xGa_yAs$ layer was grown to form a clad layer 55 having p-type $Ae_xGa_yAs$ regions 60, as described above, and an insulating layer 71 was formed thereon except for the top portion of a ridge. Subsequently, a contact layer 72 was formed on the top portion, and finally, electrodes 73 and 59 were formed.

In this manner, since the contact layer is formed only on the top portion, a lateral current through the contact layer can be eliminated, and a current can be further concentrated to improve efficiency.

Figure 13:
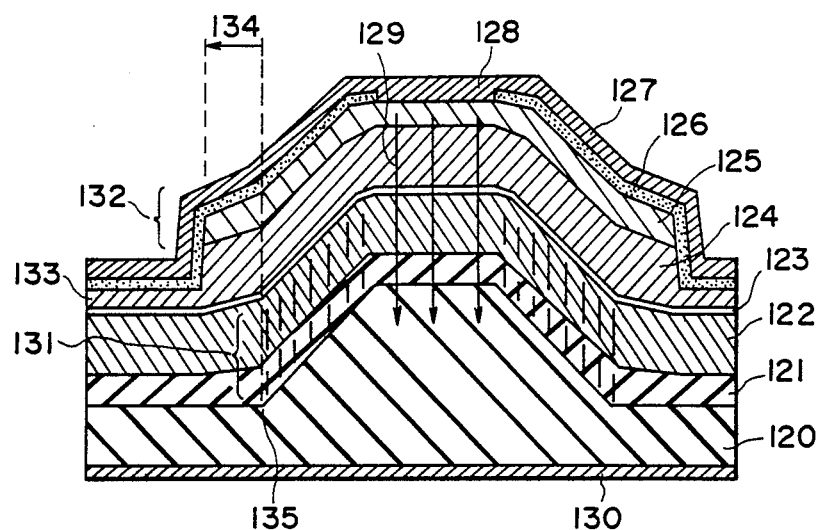

FIG. 13 is a schematic sectional view of a semiconductor laser according to a third embodiment of the present invention.

The difference between this embodiment and the above embodiments is that a second optical confinement layer is formed below the active layer.

A 0.5-μm thick Si-doped GaAs layer as a buffer layer 121 on an n-type GaAs substrate 120, and a 1.5-μm thick $Ae_xGa_yAs$ (x=0.5, y=0.5) layer 122 was formed thereon. As described above, only portions of the layer 122 corresponding to the inclined surfaces of the substrate 120 have a p-conductivity type. These regions serve as regions 131.

Furthermore, an active layer 123 was formed. In this embodiment, the layer 123 comprised a multi-layered film of GaAs and $Ae_xGa_yAs$ (x=0.3, y=0.7) layers (five 60-Å thick GaAs layers and four 100-Å thick AeGaAs layers).

A Be-doped $Ae_xGa_yAs$ (x=0.5, y=0.5) first optical confinement layer 124 was formed on the active layer 123, and a Be-doped GaAs electrode contact layer 125 was formed thereon.

In this embodiment, in order to prevent current diversification, the p-AeGaAs layer 124 and the p-GaAs layer 125 were partially removed by etching, as indicated by 132 in FIG. 13. Note that the characteristic of the laser tends to be better when the etched portion 132 does not reach the active layer 123. The remaining layer 133 of the p-AeGaAs layer 124 preferably has a thickness of 0.1 to 1 μm.

In addition, the position of the etched portion 132 is important. The position of a base 135 of the trapezoidal projection of the substrate 120 is preferably caused to coincide with that of the etched portion 132. In this case, a distance 134 therebetween is preferably decreased as small as possible. Of course, more preferably, the position of the etched portion 132 exceeds the base 135 and approaches the top portion of the ridge.

An $Si_3N_4$ 126 was formed on the remaining portion without being etched, and a top portion 128 thereof was removed. Thereafter, an electrode 127 was formed. In addition, an electrode 130 was formed.

When a voltage is applied across the electrodes 127 and 130 of the laser with the above structure, a current flows in a direction indicated by arrows 129, and is concentrated on the central portion to cause oscillation. This is because the p-type regions 131 have the current constriction effect. Since the active layer 123 is bent along the top portion and the inclined surfaces, a refractive index difference can be provided, and light is also confined in the central portion.

The number of steps in the manufacture of the above structure was increased than those of the first and second embodiments. However, a semiconductor laser with good optical and current confinement effects could be obtained since the p-regions were formed on the inclined surfaces.

In the trapezoidal shape of this embodiment, the width of the top portion of the trapezoid was 5 μm, and the height was 3 μm. Upon manufacture of a laser, the substrate preferably has a trapezoidal shape having a top width of 6 μm or less, and a height of 3 μm or less.

Figure 14:
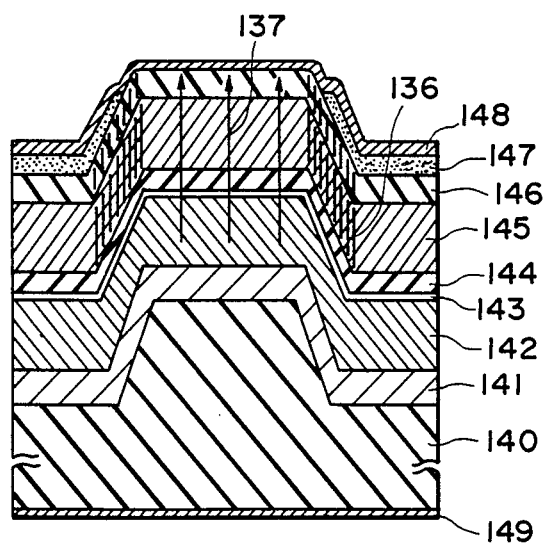

FIG. 14 is a schematic sectional view showing a semiconductor laser according to a fourth embodiment of the present invention. In FIG. 14, a p-GaAs substrate 140 has the (001) plane, and has a ridge shape extending along the <110> axis. More specifically, the substrate 140 forms a ridge along the [$\bar{1}$10] axis. FIG. 14 illustrates a structure when viewed from the ($\bar{1}$10) plane. The ridge is formed by etching using a sulfuric acid etchant. The height of the ridge is 2 μm, and the width of the ridge top portion is 6 μm. A 0.5-μm thick Be-doped GaAs buffer layer 141 was formed on the ridge by the vacuum vapor deposition method. A 1.5-μm thick p-$Ae_{0.5}Ga_{0.5}As$ clad layer 142 was formed on the buffer layer 141. A laser active layer 143 of a Multi Quantum wall (MQW) structure was formed on the clad layer 142. The layer 143 contained no impurity. Four 100-Å thick nondoped $Ae_{0.3}Ga_{0.7}As$ barrier layers and five 60-Å thick nondoped GaAs Well layers were alternately stacked to constitute the active layer 143.

An Sn-doped $Ae_{0.5}Ga_{0.5}As$ layer 144 was formed on the active layer 143 to have a thickness of 0.1 to 1.5 μm. In this embodiment, the layer 144 had a thickness of 0.3 μm. The layer 144 serves as a current constriction layer. Then, a 1.2-μm thick Si-doped $Ae_{0.7}Ga_{0.3}As$ clad layer 145 was formed on the active layer 144, and a 0.5-μm thick Si-doped GaAs contact layer 146 was formed thereon. The thickness of the layer 145 depends on the thickness of the layer 144, and a total thickness of the layers 145 and 144 is 2 μm or less. In some cases, the layer 145 may be omitted. A 3,000-Å $SiO_2$ insulating layer 147 was formed on the layer 146. Finally, an n-type electrode 148 having a composition of AuGe/Ni/Au and a p-type electrode 149 having a composition of Cr/Au were formed on the resultant structure.

When a negative voltage is applied to the n-type electrode 148 and a positive voltage is applied to the p-type electrode 149 to drive the laser, currents 137 flow through only the center of the ridge, and no current flows through p-type regions 136 formed on the inclined surfaces. This is because the Sn-doped $Ae_{0.5}Ga_{0.5}As$ layer 144 cannot have a p-conductivity type but can have an n-conductivity type even on the inclined surfaces of the ridge. The layer 144 and the p-type regions 136 are reverse-biased, and no current can flow from the p-type regions 136 to the layer 144.

Therefore, current leakage through the p-type regions on the inclined surfaces of the ridge can be greatly reduced. The threshold value of the laser oscillation can further become lower than that in the first embodiment, and a light-emitting efficiency can be improved.

The inclined surface of the ridge forms an angle of about 50° with the (001) plane on the substrate. In consideration of p/n inversion, if the (001) plane is used as the substrate, an angle defined by the inclined surface and the (001) plane must be 20° or more.

Upon manufacturing the structure of this embodiment, a substrate temperature was 700° C., and a flux ratio was less than 2. The height of the ridge in this embodiment is 10 μm or less, and more preferably 5 μm or less.

Figure 15:
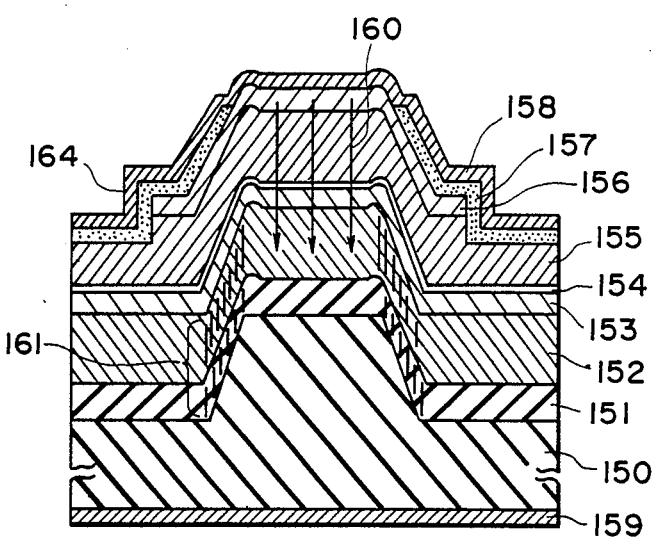

FIG. 15 is a schematic sectional view of a fifth embodiment of the present invention. The characteristic feature of this embodiment is that an n-type substrate is used, and a current is constricted by the lower portion of an active layer. An n-GaAs substrate 150 forms a ridge along the <110> axis on the (001) plane. More specifically, the ridge extends along the [1̄10] axis. The width of the top portion of the ridge is 3 μm, and the height of the ridge is 1.5 μm. A 0.5-μm Si-doped GaAs buffer layer 151 was formed on the substrate 150, and a 1.3-μm Si-doped Ae$_{0.3}$Ga$_{0.7}$As clad layer 152 was formed thereon. An Sn-doped Ae$_{0.3}$Ga$_{0.7}$As current constriction layer 153 of a thickness of 0.1 to 0.8 μm was formed on the clad layer 152. In this embodiment, the thickness of the layer 153 was set to be 0.4 μm. A 0.1-μm thick nondoped GaAs active layer 154 was formed on the layer 153. A 1.5-μm thick Be-doped Ae$_{0.3}$Ga$_{0.7}$As upper clad layer 155 was formed on the active layer 154, and a 0.5 μm thick Be-doped GaAs contact layer 156 was formed thereon.

A 0.3-μm thick Si$_2$ insulating layer 157 was formed on the contact layer 156. Thereafter, an upper portion of the ridge was removed, and a p-type electrode 158 having a composition of Cr/Au and an n-type electrode 159 having a composition of AuGe/Ni/Au were formed on the resultant structure, thus completing a semiconductor laser. In this structure, the inclined surfaces of the Si-doped GaAs layer 151 and the Ae$_{0.3}$Ga$_{0.7}$As layer 152 had a p-conductivity type.

In this embodiment, in order to prevent current leakage from p-type regions 152 on the inclined surfaces, the Sn-doped Ae$_{0.3}$Ga$_{0.7}$As layer 153 is formed. More specifically, since the inclined portions of the layer 153 are of n-conductivity type, p-n junctions formed in these portions are reverse-biased, and no current leakage can occur.

In this embodiment, since the ridge sides are removed, as indicated by 164, current diffusion in the layers 155 and 156 can be noticeably suppressed. Therefore, a semiconductor laser with a high light emission efficiency as well as current constriction utilizing reverse bias of the p-n junctions can be obtained. During the manufacture of the structure of this embodiment, a substrate temperature was 500° C., and a flux ratio was not more than 2.

Figure 16:
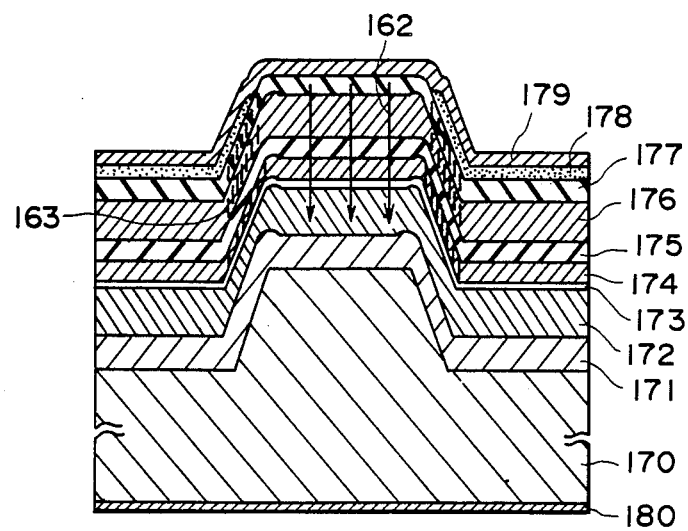
Figure 17:
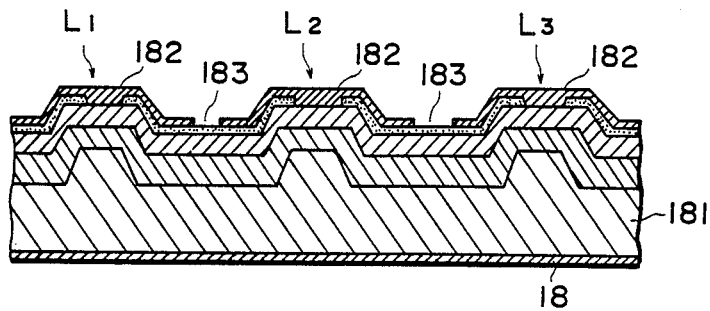

FIG. 16 is a schematic sectional view showing a sixth embodiment of the present invention. The difference between this embodiment and the previous embodiments is that an Sn-doped AeGaAs layer for current constriction is formed in a clad layer.

Referring to FIG. 16, a ridge is formed on a p-GaAs substrate 170 along the <110> axis. The height of the ridge is 3 μm, and the width of the ridge top portion is 4 μm. FIG. 16 illustrates a structure when viewed from the (1̄10) end face. A 0.5-μm thick p-GaAs buffer layer 171 was formed on the substrate 170. A 1.5-μm p-Ae$_{0.5}$Ga$_{0.5}$As clad layer 172 was formed on the buffer layer 171. A 0.1-μm nondoped GaAs active layer 173 was formed on the layer 172. A 0.3-μm thick Si-doped Ae$_{0.3}$Ga$_{0.7}$As layer 174 was formed on the active layer 173. An Sn-doped Ae$_{0.5}$Ga$_{0.5}$As layer 175 was formed on the layer 174 to have a thickness of 0.1 to 0.8 μm. In this embodiment, the thickness of the layer 175 was set to be 0.4 μm. A 1-μm thick Si-doped Ae$_{0.5}$Ga$_{0.5}$As layer 176 was formed on the layer 175. A 0.5-μm thick Si-doped GaAs layer 177 was formed on the layer 176.

A 3,000-Å thick Si$_3$N$_4$ insulating layer 178 was formed on the laser wafer grown described above, and an opening was formed on only the ridge top portion. Finally, an n-type electrode 179 having a composition of AuGe/Ni/Au and a p-type electrode 180 having a composition of Cr/Au were formed on the resultant wafer, thus completing a semiconductor laser.

In this laser, the inclined surfaces of the Si-doped layers have a p-conductivity type. However, the Si-doped Ae$_{0.5}$Ga$_{0.5}$As layer 175 has an n-conductivity type even on its inclined surfaces. Therefore, reverse-biased p-n junctions formed by the layer 175 can prevent current leakage, and a current 162 can be concentrated on the central portion of the ridge. Since an Ae content of the Si-doped Ae$_{0.3}$Ga$_{0.7}$As layer 174 is smaller by 0.2 than that of the layers 173 and 175 sandwiching the layer 174 therebetween, the layer 174 serves as an optical waveguide layer. Thus, some advantages can be provided, for example a COD (crack opening displacement) level can be improved.

During the manufacture of a structure of this embodiment, a substrate temperature was 600° C., and a flux ratio J$_{Asu}$/J$_{Ga}$ was not more than 2.

In the above embodiments, the width of the ridge top portion is about 20 μm or less and preferably, 10 μm or less although it differs depending on the growth conditions and the height of the ridge. When the semiconductor layers are formed by the vacuum deposition method, the growth conditions are preferably a substrate temperature of 400° C. to 800° C., and a flux ratio of 1 to 10, and more preferebly, 5 or less.

The Si-doped Ae$_x$Ga$_{1-x}$As has a low Si activation ratio, and hence, tends to have a high resistance. Therefore, when a drive voltage is to be suppressed, the Ae content can be increased (e.g., x=0.7 or more), or can be decreased (e.g., x=0.3 or less).

In the above embodiments, the descriptions have been made in association with a single semiconductor laser. Semiconductor lasers L$_1$, L$_2$, L$_3$, ... can be formed on a single substrate 181 to constitute a semiconductor laser array. In this case, electrodes 182 of the lasers are electrically separated from each other by isolation grooves 183. Therefore, the respective lasers can be independently driven. Note that 184 indicates a common electrode.

Another semiconductor element manufactured by the method of the present invention will be described hereinafter.

Figure 18:
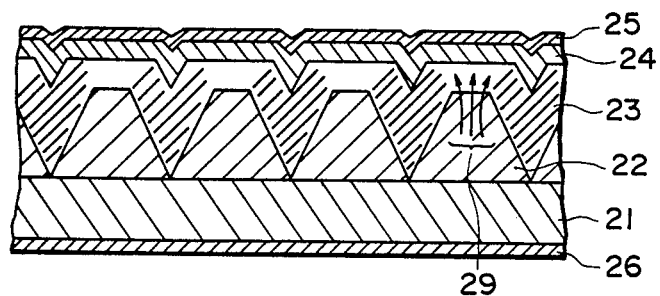
FIGS. 18 to 22 are schematic sectional views showing other semiconductor elements manufactured by the same method as in the present invention.

FIG. 18 is a schematic sectional view showing the structure of a static induction type transistor (to be referred to as an SIT hereinafter) manufactured by the method of the present invention. In the structure shown in FIG. 18, an n$^{31}$-GaAs layer 22 is formed on an n+GaAs wafer 21. An Si-doped GaAs layer 23 is formed on the layer 22, and an n+-GaAs layer 24 is formed thereon. Electrodes 25 and 26 are formed on the resultant structure. More specifically, the n$^{31}$-GaAs layer 22 having a low carrier concentration was deposited on the n$^+$-GaAs wafer 21 to have a thickness of 1 to 3 μm. The layer 22 was etched by a conventional interference exposure method to obtain a trapezoidal shape having a height of about 5,000 Å as shown in FIG. 18. In this case, an upper base of the trapezoid was parallel to the (001) plane, but the inclined surfaces corresponding to both sides of the trapezoid were parallel to the [1̄10] axis, so that the inclined surfaces were designed to define an angle of 20° or more with the (001) plane.

When the Si-doped GaAs layer was deposited on the n−-GaAs layer 22 formed as described above, the portions on the inclined surfaces indicated by hatched regions in FIG. 18 had a p-conductivity type, and an n-GaAs layer was grown on other portions. A 0.2-μm thick n-GaAs layer 24 was formed on the layer. Finally, the electrodes 25 and 26 were formed on the resultant structure.

The operation of the SIT manufactured as described above will be described below. When a voltage is applied across the electrodes 25 and 26, a current flows through a channel region of the Si-doped GaAs layer 23, as indicated by arrows 29 in FIG. 18. In this case, depletion layers are formed in the respective layers due to the carrier concentrations of the p-type regions of the layer 23 and the $n^-$-GaAs layer 22. In the $n^-$-GaAs layer 22 having a lower carrier concentration, the larger depletion layers are formed. The extension of the depletion layers in the layer 22 is changed by changing the voltage applied to the layer 23, thereby controlling the current 29. Since the SIT of this embodiment has a small channel length, a small serial resistance, and a small gate capacitance, a high-speed operation can be achieved. With the method of the present invention, the channel region can be formed to have a width of about 2,000 Å with high reproducibility. The present invention may be carried out by using photolithography instead of the interference exposure method.

Figure 19:
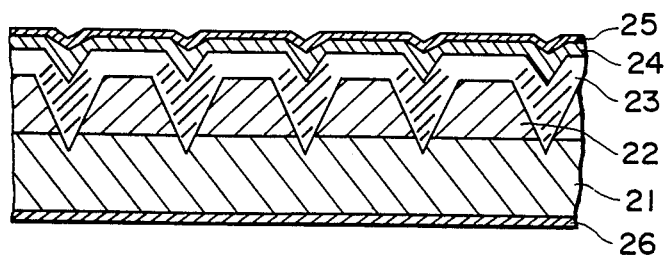
Figure 20:
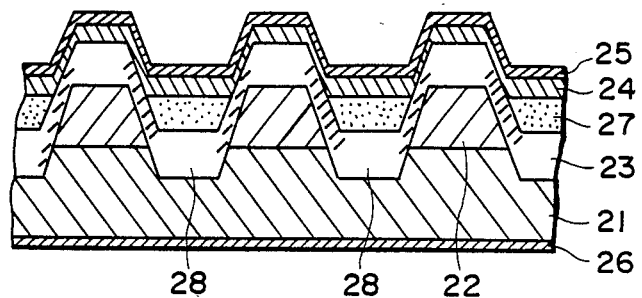

FIGS. 19 and 20 are schematic sectional views showing modifications of the SIT shown in FIG. 18. The same reference numerals in FIGS. 19 and 20 denote the same components as in FIG. 18, and a detailed description thereof will be omitted. In the SIT shown in FIG. 19, the thickness of the $n^{31}$-GaAs layer 22 in FIG. 18 is decreased to obtain a short channel (e.g., a channel length=about 3,000 Å), and a still high-speed operation can be achieved. The structure of this embodiment can be manufactured by the same method as that in FIG. 18.

FIG. 20 illustrates a structure wherein a gap between adjacent channels is wider than that of the element shown in FIG. 18, and n-type regions 28 are formed between the channels. The difference between the structures shown in FIGS. 18 and 20 is that an $SiO_2$ layer 27 is provided. The $SiO_2$ layer 27 is adopted to prevent a current flowing through the n-type regions 28.

First, the $n^{31}$-GaAs layer 22 was deposited on the $N^+$-GaAs wafer 21, and was patterned by photolithography. Thereafter, the layer 22 was etched using sulfuric acid etchant ($H_2SO_4 : H_2O_2 : H_2O = 1 : 1 : 10$) to have a trapezoidal shape having an upper base width of 2,000 Å.

When the Si-doped GaAs layer 23 was deposited on the above structure, a p-GaAs layer was grown on portions indicated by hatched regions on the inclined surfaces, and n-type regions were formed on other portions. Thereafter, the 5,000-Å thick $SiO_2$ layer 27 as the insulating layer was formed, and the portion of the layer 27 corresponding to the upper portion of the trapezoid was removed. Furthermore, when the $n^+$-GaAs layer 24 was deposited on the structure, an $n^+$-GaAs layer was grown on the upper portion of the trapezoid, and a polycrystalline GaAs layer was formed on the layer 27. Finally, the electrodes 25 and 26 were deposited on the structure.

In this manner, a high-speed transistor can be easily manufactured by the same method as in the present invention.

Figure 21:
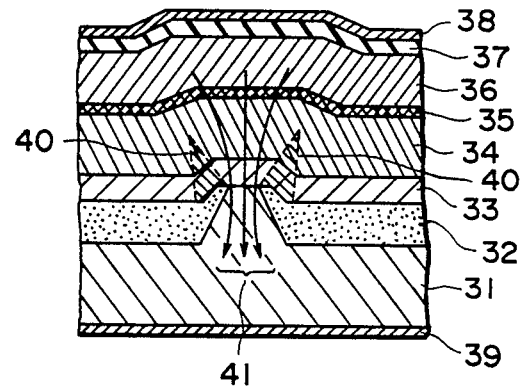

FIG. 21 is a schematic sectional view showing the structure of a semiconductor laser manufactured by the method of the present invention. The structure shown in FIG. 21 is constituted by an n-GaAs wafer 31, a p-GaAs layer 32, an n-GaAs layer 33, an n-AeGaAs buffer layer 34, an n-GaAs laser active layer 35, a p-AeGaAs layer 36, a p-GaAs gap layer 37, and electrodes 38 and 39. A substrate constituted by the wafer 31 and the p-GaAs layer 32 has a trapezoidal projection. Inclined surfaces corresponding to the sides of the trapezoid are parallel to the [$\bar{1}$10] axis, and define an angle of 20° or more with the (001) plane. Therefore, semiconductor layers grown on the inclined surfaces serve as p-type regions 40 as indicated by hatched regions in FIG. 21. When a voltage is applied across the electrodes 38 and 39, a current is constricted by the p-type regions 40, and flows through a stripe region as indicated by arrows 41. A laser beam is output from the active layer 35 at a low threshold value.

The steps in the manufacture of the semiconductor laser will now be described.

First, an n-GaAs substrate 31 was etched in a forward mesa direction to form a projection. When a 0.5-μm thick p-GaAs layer 32 was formed on the substrate 31, a thin p-GaAs layer was formed on the upper portion of the substrate 31 having a triangular shape. The resultant structure was subjected to chemical etching to remove the upper portion of the triangle so as to partially expose the substrate 31, as shown in FIG. 21. Then, a 0.5-μm thick n-GaAs layer 33, a 1.0-μm thick n-AeGaAs buffer layer 34, a 0.1-μm thick n-GaAs laser active layer 35, a 1.5-μm thick p-A GaAs buffer layer 36, and a 0.5-μm thick p-GaAs gap layer 37 were stacked on the substrate prepared described above. Finally, metal layers were respectively deposited on the semiconductor multilayered structure as the electrodes 38 and 39.

According to the present invention, the substrate can be micropatterned to set a width of a current injection region in the active layer to be about 5,000 Å, and a semiconductor laser having a low threshold value can be easily manufactured.

Figure 22:
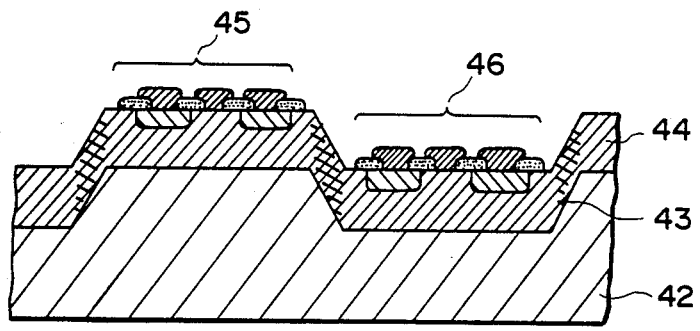

The method of the present invention can be applied to an element isolation such as a thin film transistor array. FIG. 22 shows this example.

FIG. 22 is a schematic sectional view of a semiconductor element manufactured using the method of the present invention. The structure shown in FIG. 22 includes a semi-insulative GaAs substrate 42, an Si-doped GaAs layer 44, and elements 45 and 46 formed in the layer 44. Inclined surfaces were formed on the substrate 42 to be parallel to the [$\bar{1}$10] axis and to define an angle of 20° or more with the (001) plane. When a 1-μm Si-doped GaAs layer 44 was formed on this structure, p-type regions were formed on portions indicated by hatched regions, and an n-GaAs layer was formed on other portion. When elements 45 and 46 are formed in the n-GaAs portions, the p-type regions serve as isolators, and an element isolation can be easily achieved.

In the semiconductor laser of the present invention, the ridge is formed to be substantially parallel to the <110> axis. In this case, "substantially" means a range of −30° to +30°, and more preferably, −10° to −10°.

The present invention may be used in various other applications in addition to the embodiments described above. For example, in the above embodiments, GaAs is used as a semiconductor material. If InGaAs, InAeGaP, InP, and the like are used, the present invention may also be realized.

As a convertible impurity to be doped, Ge, Sn, Pb, and the like may be employed according to growth conditions in place of Si. The molecular beam epitaxy (MBE) method is typically employed as the growth method of the present invention. Instead, the metal-organic chemical vapor deposition (MO-CVD) method may be employed.

The present invention involves all the above applications within the scope of appended claims.

What is claimed is:

1. A semiconductor laser having a laser resonator structure, comprising:

a substrate having a trapezoidal projection, said trapezoidal projection forming on both sides of an upper base an inclined surface extending along a resonating direction of a resonator;

a first semiconductor layer of a first or second conductivity type formed on said substrate;

an active layer formed on said substrate for generating a laser beam;

a second semiconductor layer which is formed on said substrate and to which an impurity of a convertible conductivity type is doped, a portion of said second semiconductor layer above the included surface of said substrate having the first conductivity type, and the other portion having the second conductivity type; and a pair of electrodes causing a current to flow through said active layer;

wherein the laser beam is emitted from a region of said active layer on said upper base of said projection by causing said current to flow through said active layer.

2. A laser according to claim 1, wherein a deposition surface on which said second semiconductor layer is formed has a portion above the inclined surface which is substantially parallel to a <110> axis indicated by a lattice direction index, and defines an angle of not less than 20° with a {001} plane indicated by the Miller index, and the other portion which defines an angle of not more than 20° with the {001} plane.

3. A laser according to claim 2, wherein said second semiconductor layer comprises Si-doped GaAs or AeGaAs.

4. A laser according to claim 1, wherein said first and second semiconductor layers are arranged to sandwich said active layer therebetween, and said first semiconductor layer has the first conductivity type.

5. A laser according to claim 4, wherein said semiconductor laser further comprises a third semiconductor layer which is in contact with said second semiconductor layer and has the second conductivity type.

6. A laser according to claim 5, wherein said third semiconductor layer is arranged between said active layer and said second semiconductor layer.

7. A laser according to claim 6, wherein said third semiconductor layer comprises Sn-doped GaAs or AeGaAs.

8. A semiconductor laser having a laser resonator structure, comprising:

a substrate on the surface of which a concave-convex like projection is formed so as to form inclined surfaces extending along a resonating direction of a resonator and having a top portion extending between said inclined surfaces;

a first semiconductor layer of a first or second conductivity type formed on said substrate;

an active layer formed on said substrate for generating a laser beam;

a second semiconductor layer which is formed on said substrate and to which an impurity of a convertible conductivity type is doped, a portion of said second semiconductor layer above the inclined surface of said substrate having the first conductivity type, and the other portion having the second conductivity type; and a pair of electrodes causing a current to flow through said active layer;

wherein the laser beam is emitted from a region of said active layer on said top portion of said projection by causing said current to flow through said active layer.

9. A laser according to claim 8, wherein said second semiconductor layer has a function to constrict said current injected by said electrodes.

10. A laser according to claim 8, wherein a deposition surface on which said second semiconductor layer is formed has a portion above the inclined surface which is substantially parallel to a <110> axis indicated by a lattice direction index, and defines an angle of not less than 20° with a {001} plane indicated by the Miller index, and the other portion which defines an angle of not more than 20° with the {001} plane.

11. A laser according to claim 10, wherein said second semiconductor layer comprises Si-doped GaAs or AlGaAs.

12. A laser according to claim 8, wherein said first and second semiconductor layers are arranged to sandwich said active layer therebetween, and said first semiconductor layer has the first conductivity type.

13. A laser according to claim 12, wherein said semiconductor laser further comprises a third semiconductor layer which is in contact with said second semiconductor layer and has the second conductivity type.

14. A laser according to claim 13, wherein said third semiconductor layer is arranged between said active layer and said second semiconductor layer.

15. A laser according to claim 14, wherein said third semiconductor layer comprises Sn-doped GaAs or AlGaAs.

16. A semiconductor laser having a laser resonator structure, comprising:

a substrate the surface of which is formed so as to have a mesa-like projection including inclined surfaces extending along a resonating direction of a resonator and, having a top portion extending between said inclined surfaces;

a first semiconductor layer of a first or second conductivity type formed on said substrate;

an active layer formed on said substrate for generating a laser beam;

a second semiconductor layer which is formed on said substrate and to which an impurity of a convertible conductivity type is doped, a portion of said second semiconductor layer above the inclined surface of said substrate having the first conductivity type, and the other portion having the second conductivity type; and a pair of electrodes causing a current to flow through said active layer;

wherein the laser beam is emitted from a region of said active layer on said top portion of said projection by causing said current to flow through said active layer.

17. A laser according to claim 16, wherein said second semiconductor layer has a function to constrict said current injected by said electrodes.

18. A laser according to claim 16, wherein a deposition surface on which said second semiconductor layer is formed has a portion above the inclined surface which is substantially parallel to a <110> axis indicated by a lattice direction index, and defines an angle or not less than 20° with a {001} plane indicated by the Miller index, and the other portion which defines an angle of not more than 20° with the {001} plane.

19. A laser according to claim 18, wherein said second semiconductor layer comprises Si-doped GaAs or AlGaAs.

20. A laser according to claim 16, wherein said first and second semiconductor layers are arranged to sandwich said active layer therebetween, and said first semiconductor layer has the first conductivity type.

21. A laser according to claim 20, wherein said semiconductor laser further comprises a third semiconductor layer which is in contact with said second semiconductor layer and has the second conductivity type.

22. A laser according to claim 21, wherein said third semiconductor layer is arranged between said active layer and said second semiconductor layer.

23. A laser according to claim 22, wherein said third semiconductor layer comprises Sn-doped GaAs or AlGaAs.

* * * * *

UNITED STATES PATENT AND TRADEMARK OFFICE
CERTIFICATE OF CORRECTION

PATENT NO. : 4,932,033
DATED : June 5, 1990
INVENTOR(S) : SEIICHI MIYAZAWA ET AL.     Page 1 of 6

It is certified that error appears in the above-identified patent and that said Letters Patent is hereby corrected as shown below:

SHEET 2 OF 8

Fig. 4, "LAYEN" should read --LAYER-- (all occurrences).

COLUMN 1

Line 58, "$Zn^{30}$." should read --$Zn^*$.--.

COLUMN 2

Line 14, "$n-Ae_xGa_yAs$" should read --$n-A\ell_xGa_yAs$--.
Line 17, "$p-Ae_xGa_yAs$" should read --$p-A\ell_xGa_yAs$--.

COLUMN 3

Line 37, "$p-Ae_xGa_yAs$" should read --$p-A\ell_xGa_yAs$--.
Line 39, "$p-Ae_xGa_yAs$ clad layer 84," should read --$p-A\ell_xGa_yAs$ clad layer 84,--.
Line 42, "$n-Ae_{x1}Ga_{y1}As$" should read --$n-A\ell_{x1}Ga_{y1}As$--.
Line 62, "n-AeGaAs layer 103" should read --n-A$\ell$GaAs layer 103--.
Line 64, "p-AeGaAs clad layer 106," should read --p-A$\ell$GaAs clad layer 106,--.
Line 65, "n-AeGaAs lower clad layer 108." should read --n-A$\ell$GaAs lower clad layer 108.--.

COLUMN 4

Line 3, "n-AeGaAs layer 103" should read --n-A$\ell$GaAs layer 103--.

UNITED STATES PATENT AND TRADEMARK OFFICE
CERTIFICATE OF CORRECTION

PATENT NO. : 4,932,033
DATED : June 5, 1990
INVENTOR(S) : SEIICHI MIYAZAWA ET AL.

It is certified that error appears in the above-identified patent and that said Letters Patent is hereby corrected as shown below:

COLUMN 5

Line 57, "invent on" should read --invention--.

COLUMN 6

Line 11, "mesa-like projector" should read
           --mesa-like projection--.
    Line 28, "arbitray" should read --arbitrarily--.
    Line 40, "0.5-μthick Be-doped GaAs buffer layer 52"
           should read
           --0.5-μm thick Be-doped GaAs buffer layer 52--.
    Line 41, "$Ae_xGa_yAs$" should read --$Al_xGa_yAs$--.
    Line 46, "1.5-μm thick Si-doped $Ae_xGa_yAs$ layer" should
           read --1.5-μm thick Si-doped $Al_xGa_yAs$ layer--.
    Line 51, "p-type $Ae_xGa_yAs$ layer" should read
           --p-type $Al_xGa_yAs$ layer--.
    Line 53, "p-type $Ae_xGa_yAs$ regions" should read
           --p-type $Al_xGa_yAs$ regions--.
    Line 56, "n-type $Ae_xGa_yAs$ region." should read
           --n-type $Al_xGa_yAs$ region.--.

COLUMN 7

Line 1, "Si-doped $Ae_xGa_yAs$ layer" should read
           --Si-doped $Al_xGa_yAs$ layer--.
    Line 2, "p-type $Ae_xGa_yAs$" should read
           --p-type $Al_xGa_yAs$--.
    Line 20, "$Ae_xGa_yAs$" should read --$Al_xGa_yAs$--.
    Line 27, "$Ae_xGa_yAs$" should read --$Al_xGa_yAs$--.

UNITED STATES PATENT AND TRADEMARK OFFICE
CERTIFICATE OF CORRECTION

PATENT NO. : 4,932,033
DATED : June 5, 1990
INVENTOR(S) : SEIICHI MIYAZAWA ET AL.

It is certified that error appears in the above-identified patent and that said Letters Patent is hereby corrected as shown below:

COLUMN 7 cont'd.

Line 29, "AeGaAs layers)." should read --$A\ell GaAs$ layers).--.
Line 30, "$Ae_xGa_yAs$" should read --$A\ell_xGa_yAs$--.
Line 35, "p-AeGaAs layer 124" should read --p-$A\ell GaAs$ layer 124--.
Line 40, "p-AeGaAs layer 124" should read --p-$A\ell GaAs$ layer 124--.
Line 50, "$Si_3N_4$ 126" should read --$Si_3N_4$ layer 126--.
Line 64, "increased" should read --greater--.

COLUMN 8

Line 18, "p-$Ae_{0.5}Ga_{0.5}As$ clad layer 142" should read --p-$A\ell_{0.5}Ga_{0.5}As$ clad layer 142--.
Line 22, "100-Å thick nondoped $Ae_{0.3}Ga_{0.7}$ As barrier layers" should read --100-Å thick nondoped $A\ell_{0.3}Ga_{0.7}$ As barrier layers--.
Line 25, "Sn-doped $Ae_{0.5}Ga_{0.5}As$ layer 144" should read --Sn-doped $A\ell_{0.5}Ga_{0.5}As$ layer 144--.
Line 29, "1.2-μm thick Si-doped $Ae_{0.7}Ga_{0.3}As$ clad layer" should read --1.2-μm thick Si-doped $A\ell_{0.7}Ga_{0.3}$ As clad layer--.
Line 45, "$Ae_{0.}$" should read --$A\ell_{0.}$--.
Line 46, "$5Ga_{0.5}As$ layer 144" should read --$_5Ga_{0.5}As$ layer 144--.

UNITED STATES PATENT AND TRADEMARK OFFICE
CERTIFICATE OF CORRECTION

PATENT NO. : 4,932,033
DATED : June 5, 1990
INVENTOR(S) : SEIICHI MIYAZAWA ET AL.   Page 4 of 6

It is certified that error appears in the above-identified patent and that said Letters Patent is hereby corrected as shown below:

COLUMN 9

Line 8, "1.3-μm Si-doped $Ae_{0.3}Ga_{0.7}As$ clad layer 152" should read --1.3-μm Si-doped $Aℓ_{0.3}Ga_{0.7}As$ clad layer 152--.

Line 9, "Sn-doped $Ae_{0.3}Ga_{0.7}As$ current" should read --Sn-doped $Aℓ_{0.3}Ga_{0.7}As$ current--.

Line 15, "$Ae_{0.3}Ga_{0.7}As$ upper clad layer 155" should read --$Aℓ_{0.3}Ga_{0.7}As$ upper clad layer 155--.

Line 25, "$Ae_{0.3}Ga_{0.}$" should read --$Aℓ_{0.3}Ga_{0.}$--.

Line 29, "Sn-doped $Ae_{0.3}Ga_{0.7}As$ layer 153" should read --Sn-doped $Aℓ_{0.3}Ga_{0.7}As$ layer 153--.

Line 46, "Sn-doped AeGaAs layer" should read --Sn-doped AℓGaAs layer--.

Line 53, "1.5-μm p-$Ae_{0..}$" should read --1.5-μm p-$Aℓ_{0..}$--.

Line 56, "0.3-μm thick Si-doped $Ae_{0..}$" should read --0.3-μm thick Si-doped $Aℓ_{0..}$--.

Line 57, "$3Ga_{0.7}As$ layer 174" should read --$_3Ga_{0.7}As$ layer 174--.

Line 58, "Sn-doped $Ae_{0.5}Ga_{0.5}As$ layer 175" should read --Sn-doped $Aℓ_{0.5}Ga_{0.5}As$ layer 175--.

Line 61, "1-μm thick Si-doped $Ae_{0.5}Ga_{0.5}As$ layer 176" should read --1-μm thick Si-doped $Aℓ_{0.5}Ga_{0.5}As$ layer 176--.

UNITED STATES PATENT AND TRADEMARK OFFICE
CERTIFICATE OF CORRECTION

PATENT NO. : 4,932,033

DATED : June 5, 1990

INVENTOR(S) : SEIICHI MIYAZAWA ET AL.          Page 5 of 6

It is certified that error appears in the above-identified patent and that said Letters Patent is hereby corrected as shown below:

COLUMN 10

Line 5, "$Ae_{0.5}Ga_{0.5}As$ layer 175" should read --$Al_{0.5}Ga_{0.5}As$ layer 175--.

Line 9, "Ae" should read --$Al$--.

Line 10, Si-doped $Ae_{0.3}Ga_{0.7}As$ layer 174" should read --Si-doped $Al_{0.3}Ga_{0.7}As$ layer 174--.

Line 27, "Si-doped $Ae_xGa_{1-x}As$" should read --Si-doped $Al_xGa_{1-x}As$--.

Line 29, "Ae" should read --$Al$--.

Line 48, "$n^{31}$-GaAs layer 22" should read --$n^-$-GaAs layer 22--.

Line 49, "n+GaAs wafer 21." should read --$n^+$-GaAs wafer 21.--.

Line 52, "$n^{31}$-GaAs" should read --$n^-$-GaAs--.

Line 65, "n---GaAs layer 22" should read --$n^-$-GaAs layer 22--.

COLUMN 11

Line 29, "$n^{31}$-GaAs layer 22" should read --$n^-$-GaAs layer 22--.

Line 42, "$n^{31}$-GaAs layer 22" should read --$n^-$-GaAs layer 22--.

Line 68, "n-AeGaAs" should read --n-$Al$GaAs--.

COLUMN 12

Line 2, "AeGaAs layer 36," should read --$Al$GaAs layer 36,--.

Line 58, "—10°." should read --+10 .--.

UNITED STATES PATENT AND TRADEMARK OFFICE
CERTIFICATE OF CORRECTION

PATENT NO. : 4,932,033

DATED : June 5, 1990

INVENTOR(S) : SEIICHI MIYAZAWA ET AL.    Page 6 of 6

It is certified that error appears in the above-identified patent and that said Letters Patent is hereby corrected as shown below:

COLUMN 13

Line 40, "AeGaAs." should read --AℓGaAs.--.
Line 54, "AeGaAs." should read --AℓGaAs.--.
Line 57, "concave-convex" should read
--concave-convex---.

Signed and Sealed this

Twelfth Day of May, 1992

Attest:

DOUGLAS B. COMER

Attesting Officer    Acting Commissioner of Patents and Trademarks